United States Patent
Iino et al.

(10) Patent No.: US 6,380,753 B1
(45) Date of Patent: Apr. 30, 2002

(54) SCREENING METHOD OF SEMICONDUCTOR DEVICE AND APPARATUS THEREOF

(75) Inventors: Shinji Iino; Itaru Iida, both of Yamanashi-ken (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 09/263,873

(22) Filed: Mar. 8, 1999

(30) Foreign Application Priority Data

Mar. 14, 1998 (JP) .......................................... 10-082646

(51) Int. Cl.$^7$ ............................................. G01R 31/26
(52) U.S. Cl. ....................................................... 324/765
(58) Field of Search ................................ 324/754, 755, 324/765, 158.1

(56) References Cited

U.S. PATENT DOCUMENTS 5,701,666 A * 12/1997 DeHaven et al. .............. 29/831

OTHER PUBLICATIONS

Doug Josephson, et al., "Microprocessor $I_{DDQ}$ Testing: A Case Study," IEEE Design & Test Of Computers, (Summer 1995), pp. 42–52. (also published as "Microprocessor $I_{DDQ}$ Testing: A Case Study," Nikkei Electronics, No. 657, [Mar. 11, 1996], pp. 149–162.).

* cited by examiner

*Primary Examiner*—Ernest Karlsen
*Assistant Examiner*—Russell M. Kobert
(74) *Attorney, Agent, or Firm*—Oblon, Spivak, McClelland, Maier & Neustadt, P.C.

(57) ABSTRACT

A power supply applies a power supply voltage to a large number of devices formed on a wafer W. In the state where the devices are quiescent, the quiescent power supply currents flowing through them are measured. If measurements are greater than a setting value, the corresponding devices are determined to be defective. A cutoff circuit prevents voltage application to such defective devices. After this preliminary test, an IDDQ test, an AC test, a DC test and a function test are executed. These tests are executed not by a control station but by an application/measurement module provided for a prober.

12 Claims, 5 Drawing Sheets

SCREENING METHOD OF SEMICONDUCTOR DEVICE AND APPARATUS THEREOF

BACKGROUND OF THE INVENTION

The present invention relates to a screening method and a screening prober. More particularly, the present invention relates to a screening method and a screening prober that are used for removing defective semiconductor elements from among the semiconductor elements formed on a semiconductor wafer before electric characteristic tests of various kinds are executed with respect to each of the semiconductor elements. (In the description below, the "semiconductor wafer" will be referred to simply as a "wafer", and the "semiconductor element" will be referred to as a "device".)

Electric characteristic tests are executed with respect to devices before these devices are packaged, i.e., in the state where they are on a wafer. Only those devices that are determined to be good in quality are packaged. Broadly speaking, electric characteristic tests that are executed for devices formed on a wafer are classified into a DC test, AC test and a function test. By these tests, the devices are screened to select good ones. A prober and a tester are employed in the tests. A signal from the tester is supplied to each of the devices on the wafer through the prober. Measurement signals from the devices are supplied to the tester. On the basis of the measurement signals, the tester screens the devices to pick out defective ones.

With the recent development in fine structure working technology, the integration density of devices has been remarkably enhanced, and the devices have a large number of functions. Since the device are large in scale and are highly sophisticated, the inspection for screening the devices to remove defective ones cannot be executed with high efficiency. In other words, the inspection time are very long and the inspection requires high cost. In addition, more and more breakdowns are attributed to such defects as cannot be easily detected in function tests. As a result, even devices that have passed the shipping inspection and are to be shipped as finished products may include a large number of defective ones which are due to the defects of the devices themselves. In addition, the sophistication of devices has resulted in the necessity of using more complicated test patterns, which are difficult to design.

In order to lower the inspect cost and to enhance the breakdown detection rate, attention is paid to technology that enables an IDDQ (IDD quiescent) test, a BIST (a built-in self test), a BISE (built-in self exercise), etc. to be executed with ease. Of these tests, the IDDQ test is a test in which a very small amount of power supply current flowing in a device in the quiescent state is detected by use of different test pattern signals, and the differences among the power supply currents are utilized for the detection of a defect. The IDDQ test can be executed by merely inputting test pattern signals to internal nodes of a device and determining a current value used for the detection of a defect for each of the pattern signals. Even though the IDDQ test uses a small number of test pattern signals, it enables detection of these defects which cannot be detected in the DC test or function test. For example, the IDDQ test enables detection of a short circuit, an open circuit, an insulation failure, etc. Recently, the IDDQ test attracts attention of those skilled in the art since it can supplement the function test.

Unlike the BIST and BISE, the IDDQ test enables a device to be externally inspected without having to incorporate a test circuit in the device. Therefore, the IDDQ test is considered advantageous in that it does not result in an increased device area or a deterioration in the device function. If the IDDQ test is used in an early stage of the test process, defective devices can be picked out by screening, so that the inspection costs that are required for the execution of subsequent tests, including the DC test, the AC test and the function test, can be remarkably lowered.

A problem of the prior art is that if power supply current is kept supplied to a defective device during the screening of devices, an abnormal amount of current flows from the defective device, burning out the measuring system.

Another problem of the prior art is that the number of wires used between the tester and the prober is very large, and the apparatus is inevitably large, accordingly.

BRIEF SUMMARY OF THE INVENTION

An object of the present invention is to provide a solution to at least one of the problems described above.

Another object of the present invention is to prevent a power supply current from flowing to a defective device by providing a current cutoff structure, thereby preventing a measurement system from being burnt out due to an abnormal amount of current which might be generated from the defective device.

A further object of the present invention is to provide a screening method and a screening prober which enable an IDDQ test to be executed on the side of the prober before electric characteristic inspection, including a DC test, an AC test and a function test, is carried out with respect to devices, which helps realize a compact structure and enables a remarkable reduction in the number of wires that must be connected to a control section, and which enables low-cost manufacture of devices.

According to the first aspect of the present invention, there is provided a method used for screening semiconductor devices formed on a semiconductor wafer and comprising:

applying a power supply voltage to a large number of the semiconductor devices;

measuring of a quiescent power supply current which flows in each of the semiconductor devices when the power supply voltage is applied thereto;

determining that each of the semiconductor devices is one of a non-defective device and a defective device based on a value of the quiescent power supply current; and preventing to apply a power supply voltage to the semiconductor device that is determined to be a defective device.

In the screening method described above, the determining preferably includes:

determining of a setting value;

comparing of the value of the quiescent power supply current with the setting value; and .

determining the semiconductor devices to be defective if values of the quiescent power supply currents flowing through the semiconductor devices are greater than the setting value.

In the screening method described above, the preventing to apply the power supply voltage is preferably followed by:

specifying the semiconductor devices other than those which have been determined to be defective; and inspecting of electric characteristics of the semiconductor devices that have been specified.

In the screening method described above, the inspecting electric characteristics preferably includes screening based on an IDDQ test.

According to the second aspect of the present invention, there is provided a method used for screening semiconductor devices and comprising:

applying a power supply voltage from a power supply source to a large number of the semiconductor devices by way of an application/measurement module, the power supply source being provided for a control station connected to a main apparatus through the application/measurement module, and semiconductor devices being formed on a semiconductor wafer placed inside the main apparatus;

measuring a quiescent power supply current which flows in each of the semiconductor devices when the power supply voltage is applied thereto, the quiescent power supply current being measured in the application/measurement module;

determining that each of the semiconductor devices is one of a non-defective element and a defective element based on a value of the quiescent power supply current; and preventing to apply the power supply voltage to a semiconductor device that is determined to be a defective device.

In the screening method of the second aspect, the determining preferably includes:

determining a setting value in the application/measurement module;

comparing the value of the quiescent power supply current with the setting value in the application/measurement module; and determining semiconductor devices to be defective if values of quiescent power supply currents flowing through the semiconductor devices are greater than the setting value in the application/measurement module.

It is preferable that the screening method of the second aspect further includes:

specifying semiconductor devices other than those which have been determined to be defective in the application/measurement module; and inspecting another electric characteristics of the semiconductor devices that have been specified in the application/measurement module.

In the screening method of the second aspect, the inspecting another electric characteristics preferably includes screening based on an IDDQ test.

In the screening method of the second aspect, the inspecting another electric characteristics preferably includes a process in which at least one of a BIST and a BISE is carried out.

In the screening method of the second aspect, the inspecting another electric characteristics includes bringing the semiconductor devices into simultaneous contact with contactors arranged inside a main apparatus.

In the screening method of the second aspect, the inspecting another electric characteristics is executed by index-feeding the semiconductor wafer with reference to contactors arranged inside a main apparatus.

According to the third aspect of the present invention, there is provided a prober for screening semiconductor devices, which comprises:

a main apparatus including a main chuck on which the semiconductor wafer is placed, and contactors which are brought into electric contact with a large number of semiconductor devices formed on the semiconductor wafer placed on the main chuck;

a power supply, connected to the contactors, for applying voltage to the semiconductor devices through the contactors;

a measured current monitoring apparatus, connected to the semiconductor devices, for measuring quiescent power supply currents that flow through the semiconductor devices when the semiconductor devices are applied with the voltage, and for determining that each of the semiconductor devices is one of a non-defective device and a defective device on the basis of measurement of the quiescent power supply currents; and a voltage cutoff circuit for cutting off application of the voltage to a semiconductor device that has been determined to a defective element.

In the screening prober of the third aspect, it is preferable that the measured current monitoring apparatus be an apparatus that determines a setting value beforehand, compares the quiescent power supply currents with the setting value, and determines a semiconductor device to be defective if the quiescent power supply current flowing through that semiconductor device is greater than the setting value.

It is preferable that the screening prober of the third aspect further comprise:

an apparatus for specifying semiconductor devices other than those which have been determined to be defective; and an inspection apparatus for inspecting electric characteristics of the semiconductor devices that have been specified.

In the screening prober of the third aspect, it is preferable that the inspection apparatus execute at least an IDDQ test.

According to the fourth aspect of the present invention, there is provided a prober for screening semiconductor devices, which comprises:

a main apparatus including a main chuck on which a semiconductor wafer is placed, and contactors which are brought into electric contact with a large number of the semiconductor devices formed on the semiconductor wafer placed on the main chuck;

a power supply, connected to the main apparatus, for applying voltage to the semiconductor devices through the contactors;

a measured current monitoring apparatus, connected to the main apparatus, for measuring quiescent power supply currents that flow through the semiconductor devices when the semiconductor devices are applied with the voltage, and for determining that each of the semiconductor devices is one of a non-defective device and a defective device on the basis of measurement of the quiescent power supply currents; and a cutoff circuit, connected between the power supply and the main apparatus, for cutting off application of power supply voltage to the semiconductor device on the basis of determination made by the measured current monitoring apparatus.

In the screening prober of the fourth aspect, is preferable that the measured-current monitoring apparatus be an apparatus that determines a setting value beforehand, compares the quiescent power supply currents with the setting value, and determines a semiconductor device to be defective if the quiescent power supply current flowing through that semiconductor device is greater than the setting value.

It is preferable that the screening prober of-the fourth aspect further comprise:

an apparatus for specifying semiconductor devices other than those which have been determined to be defective; and an inspection apparatus for inspecting electric characteristics of the semiconductor devices that have been specified.

In the screening prober of the fourth aspect, it is preferable that the inspection apparatus execute at least an IDDQ test.

In the screening prober of the fourth aspect, it is preferable that the inspection apparatus execute at least one of a BIST and a BISE.

In the screening prober of the fourth aspect, the contactors preferably include a mechanism for enabling simultaneous contact with the semiconductor devices, and the screening prober preferably includes:

a controller for controlling an order in which measurement is made with respect to semiconductor devices which are included among those in contact with the contactors and which have been specified;

a multiplexer, connected between the contactors and the measured-current monitoring apparatus and operating under the controller, for switching the semiconductor devices one to another and sequentially connecting the semiconductor devices to the measured-current monitoring apparatus; and a measurement result storage apparatus, connected to the measured-current monitoring apparatus, for storing results of measurement obtained by the measured-current monitoring apparatus.

It is preferable that the screening prober of the fourth aspect further comprise:

a pattern storage apparatus for storing test patterns used in the IDDQ test;

a pattern driver, connected to the pattern storage apparatus, for outputting the test pattern signal stored in the pattern storage apparatus; and a multiplexer for sequentially applying the test pattern signal from the pattern driver to the semiconductor devices that have been specified.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 1 shows how a screening prober according to one first embodiment of the present invention looks like;

FIG. 5 is a block diagram showing a screening prober according to another embodiment of the present invention looks like.

DETAILED DESCRIPTION OF THE INVENTION

The present invention will now be described in detail, referring to the embodiments shown in FIGS. 1 through 6.

Figure 1:
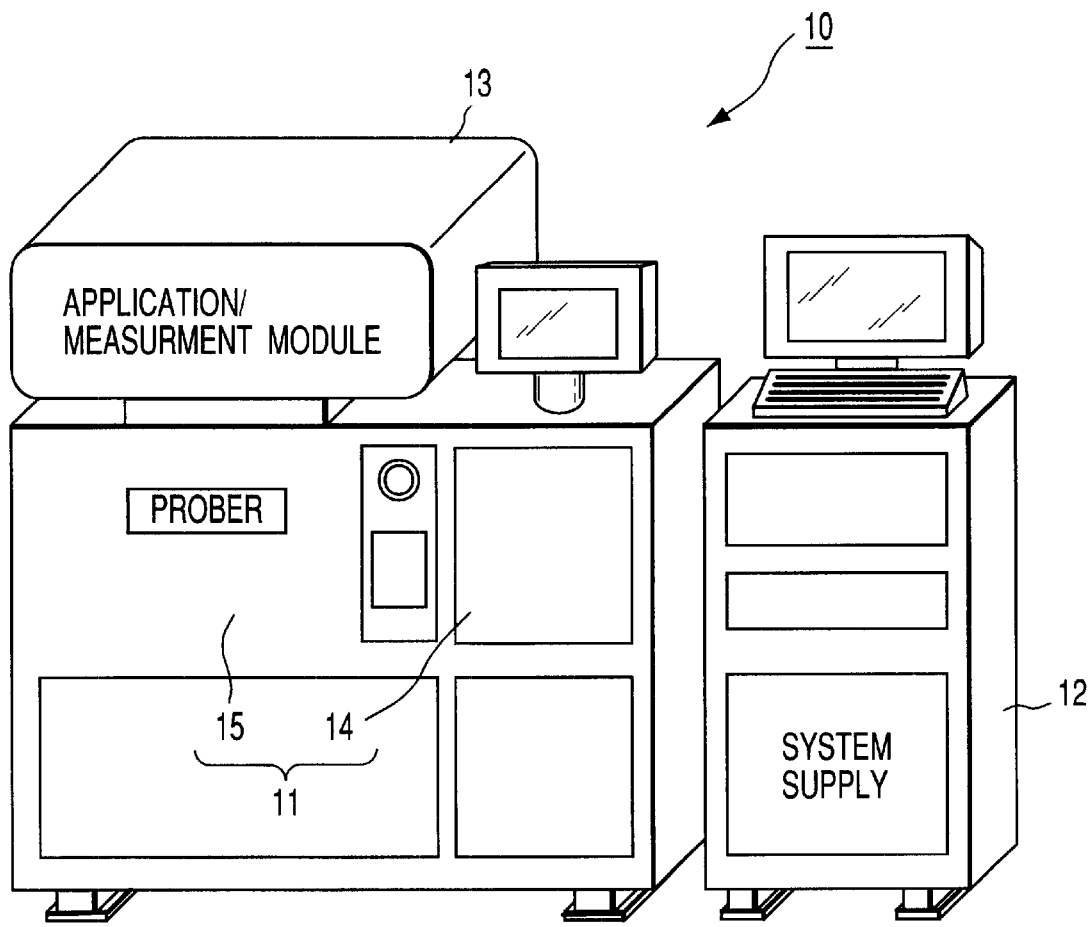
Figure 2:
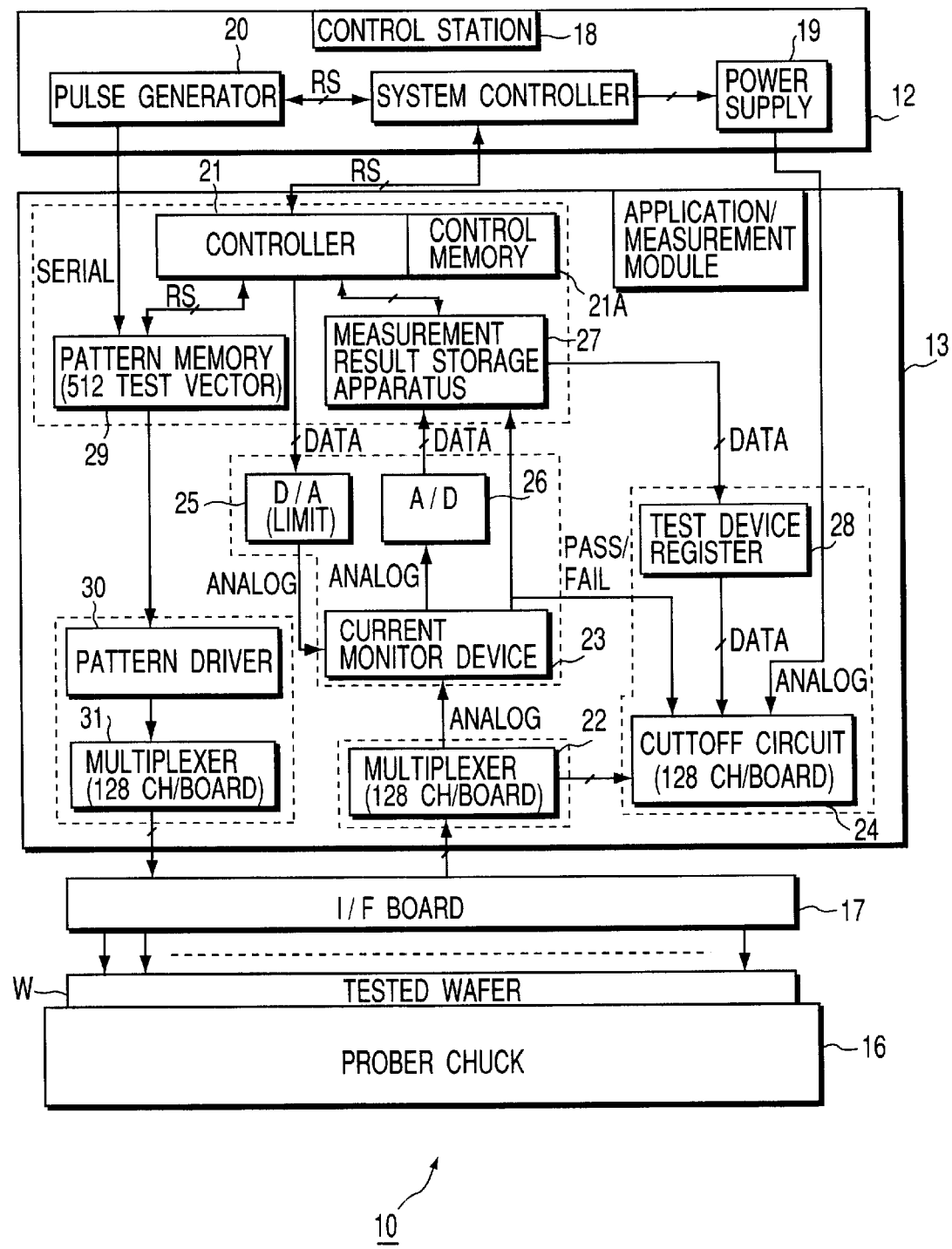
FIG. 2 is a block diagram showing the constitution of the screening prober shown in FIG. 1.

As shown in FIGS. 1 and 2, a screening prober 10 of the first embodiment comprises a main apparatus (hereinafter referred to as a main prober apparatus) 11, a control station 12 located adjacent to the main prober apparatus 11, and an application/measurement module 13 operating under the control of the control station 12. The application/measurement module 13 is located on the main prober apparatus 11.

As shown in FIGS. 1 and 2, the main prober apparatus 11 is provided with: a loader section 14 in which wafers W transportable on a carrier at one time can be contained; a prober section 15 located adjacent to the loader section 14. Inside the loader section 14, a fork (not shown) serving as a transport mechanism is arranged. By means of the fork, a wafer W is transported onto a prober chuck 16 which is movable in the X, Y, Z and θ direction.

An I/F board 17 having contactors (not shown in FIGS. 1 and 2) is arranged above the prober chuck 16. By a positioning mechanism (not shown), the inspection electrode pads of the devices which are formed on the wafer W placed on the prober chuck 16 are positioned with reference to the contactors of the I/F board 17. In the first embodiment, the contactors of the I/F board 17 are brought into simultaneous contact with the inspection electrode pads of all devices formed on the wafer W. However, the contactors may be brought into contact with the inspection electrode pads of some of the devices.

The control station 12 described above comprises: a system controller 18 for controlling the application/measurement module 13; and a power supply 19 and a pulse generator 20 which operate under the control of the system controller 18. When the devices formed on a wafer W are subjected to the IDDQ test or preliminary tests executed before the IDDQ test, the power supply 19 applies a power supply voltage to the devices. The pulse generator 20 generates test pattern signal used for the IDDQ test.

The application/measurement module 13 comprises: a controller (hereinafter referred to as a test sequencer) 21; a multiplexer 22 operating under the control of the test sequencer 21 and switches the devices in units of one device or a predetermined number of devices; a current monitor device 23 for monitoring the quiescent power supply current that flows through a device selected by the multiplexer 22; and a cutoff circuit 24 for cutting off the power supply voltage applied to the device from the power supply 19, on the basis of the monitor results of the current monitor device 23.

The cutoff circuit 24 has voltage cutoff mechanisms corresponding to the respective devices, and allows or prohibits application of a power supply voltage in accordance with the state (non-defective or defective) of each device.

The test sequencer 21 comprises a control memory 21A, and this control memory stores control contents received from the system controller 18. On the basis of the control contents, the test sequencer 21 controls the components of the application/measurement module 13. The components of the application/measurement module 12 are isolated from the control station 12. With this structure, the components of the application/measurement module 13 are not adversely affected by the lines extending therefrom to the control station 12, and can therefore be controlled with high precision.

A D/A converter 25 is arranged between the test sequencer 21 and the current monitor device 23. Limit values of quiescent power supply currents, which are stored in the control memory 21A, are supplied to, and registered in the current monitor device 23 by way of the D/A converter 25. A plurality of limit values can be registered in the current monitor device 23 in accordance with the types of devices.

In a preliminary test, the current monitor device 23 receives a quiescent power supply current which flows thereto from the device selected by the multiplexer 22 by way of the I/F board 17 and compares the value of the received quiescent power supply current with a limit value registered beforehand. The device is determined as defective if the quiescent power supply current is greater than the limit value, and is determined as non-defective if it is not. In the case where the current monitor device 23 detects a defective device, the cutoff circuit 24 operates and prohibits the voltage application by the power supply 19. Accordingly, an abnormal amount of current is prevented from flowing to the measurement system. In the case where the current monitor device 23 detects a non-defective device, the cutoff circuit 24 does not operate. Therefore, the power supply voltage from the power supply is applied to each of the devices.

A description will now be described as to how the IDDQ test is executed. An A/D converter 26 and a measurement result storage device (hereinafter referred to as a test result memory) 27 are arranged between the current monitor device 23 and the test sequencer 21. Measurements obtained by the current monitor device 23 are supplied to the test result memory 27 by way of the A/D converter 26, and are stored as data in that memory. The test sequencer 21 reads the data in the test result memory 27 and selects only the non-defective devices as devices to be subjected to the IDDQ test.

From the current monitor device 23, the test result memory 27 receives data on the non-defective devices and data on the defective devices and stores the received data. A test device register 28 is arranged between the test result memory 27 and the cutoff circuit 24. The test device register 28 is supplied with the data on the non-defective devices and/or the data on the defective devices from the test result memory 27. To be more specific, the test device register 28 stores the chip addresses of the devices to be checked. When the IDDQ test is executed, the test device register 28 controls the cutoff circuit 24 in such a manner that a power supply voltage can be applied to the devices.

A pattern memory 29 is connected to both the pulse generator 20 and the test sequencer 21. The pattern memory stores test patterns generated by the pulse generator 20. Where the test patterns are multi-bit patterns, such as BIST patterns, a plurality of pattern memories are employed for the respective bits.

The test sequencer 21 reads a test pattern from the pattern memory 29, determines the limit value of the quiescent power supply current in accordance with the read test pattern, and sets the current-monitor device 23 based on this limit value.

The screening prober 10 of the first embodiment is controlled only by the application/measurement module 13, after a test pattern is stored in the pattern memory 29. In this state, the screening prober 10 is ready to screen the devices.

A pattern driver 30 and a multiplexer 31 are connected to the pattern memory 29 in the order mentioned. The pattern driver 30 and the multiplexer 31 constitute a device which executes the IDDQ test by examining electric characteristics of devices..

The pattern driver 30 reads a test pattern from the pattern memory 29 and applies the test pattern to a device that is selected by the multiplexer 31 as a device to be tested.

The current monitor device 23 monitors the quiescent power supply current that flows through each device when the test pattern signal is applied to the devices.

Figure 3:
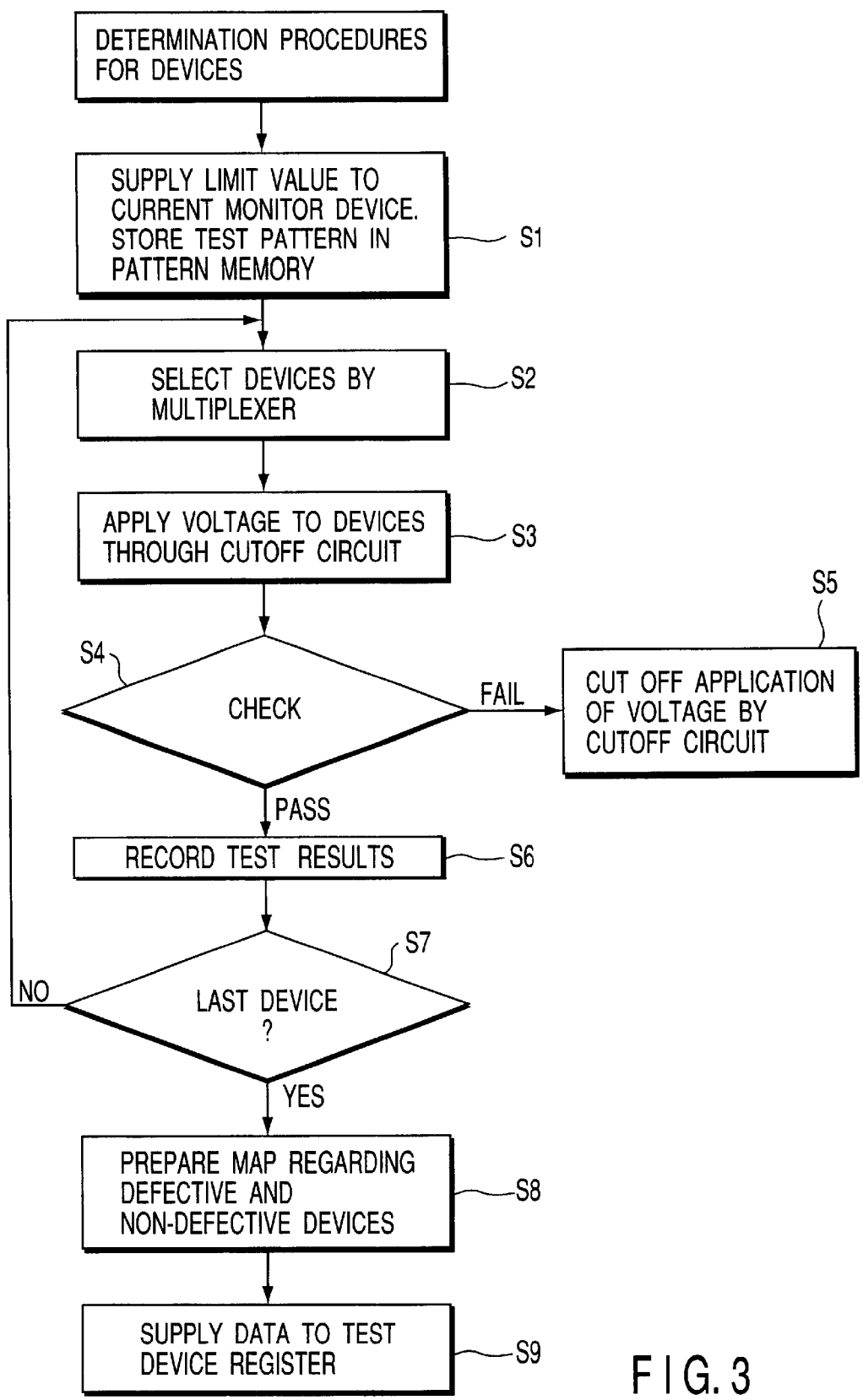
FIG. 3 is a flowchart based on which defective devices on a wafer are determined by use of the screening prober shown in FIG. 1.

The steps for executing the IDDQ test will be described with reference to FIGS. 3 and 4. Prior to the IDDQ test, a preliminary test is executed. In this preliminary test, a check is made to see whether an abnormal amount of current flows through each of the devices. Those devices through which such current flows are picked out as defective devices. The preliminary test is executed by following the steps shown in FIG. 3.

The current monitor device 23 is set in accordance with the limit value of the quiescent power supply current, which value may be determined in accordance with each device. The limit value is supplied from the system controller 18 of the control station 12 to the current monitor device 23 by way of the test sequencer 21 of the application/measurement module 13. In addition, a test pattern generated by the pulse generator 20 is stored in the pattern memory 29 (Step S1). After this operation, the IDDQ test described below can be executed under the control of the application/measurement module 13.

Before the test is executed, the prober chuck 16 is driven, and the positioning mechanism positions a wafer W and the I/F board 17 relative to each other. As shown in FIG. 2, all or some of the devices formed on the wafer W are brought into electric contact with the I/F board 17.

Thereafter, a power supply voltage is applied from the power supply 19 of the control station 12, and the multiplexer 22 selects a predetermined number of devices under the control of the test sequencer 21 (Step S2).

The devices selected in Step S2 are applied with the power supply voltage of the power supply 19 by way of both the current cutoff circuit 24 and the I/F board 17 (Step S3).

The quiescent power supply current that flows through each device when the power supply voltage is applied thereto is detected, and is supplied to the current monitor device 23 by way of the I/F board 17. The current monitor device 23 measures the quiescent power supply current flowing through each device. Based on this measurement, a check is made to see whether or not the quiescent power supply current of each device exceeds the limit value (Step S4).

In regard to the devices that are determined to be defective in Step S4, the cutoff circuit 24 blocks off the paths leading thereto from the power supply 19. In this manner, the defective devices are prevented from being applied with the power supply voltage (Step S5). As a result, an abnormal amount of current does not flow from the defective devices to the measurement system, and the measurement system is not burned out. In addition, information on the devices are supplied through the A/D converter 26 to the test result memory 27, and are recorded in this memory as defective ones.

When step S4 shows that the measurements obtained by the current monitor device 23 are lower than the limit value, then the corresponding devices are determined to be non-defective. The power supply voltage is applied to those devices, with the cutoff circuit 24 being kept off in the meantime. In addition, information on the device are supplied through the A/D converter 26 to the test result memory 27, and are recorded in this memory as non-defective device information (Step S6).

After the data are recorded in the test result memory 27, a check is made to see whether or not there are devices to be measured next (Step S7).

If there are devices to be measured, the processing shown in Steps S1 to S7 are repeated for these devices.

If step S7 shows that there is no device to be measured, a map regarding the defective and nondefective devices is prepared on the basis of the measurement (Step S8).

Information on the devices that have been determined to be non-defective are supplied from the test result memory 27 to the test device register 28 (Step S9).

Figure 4:
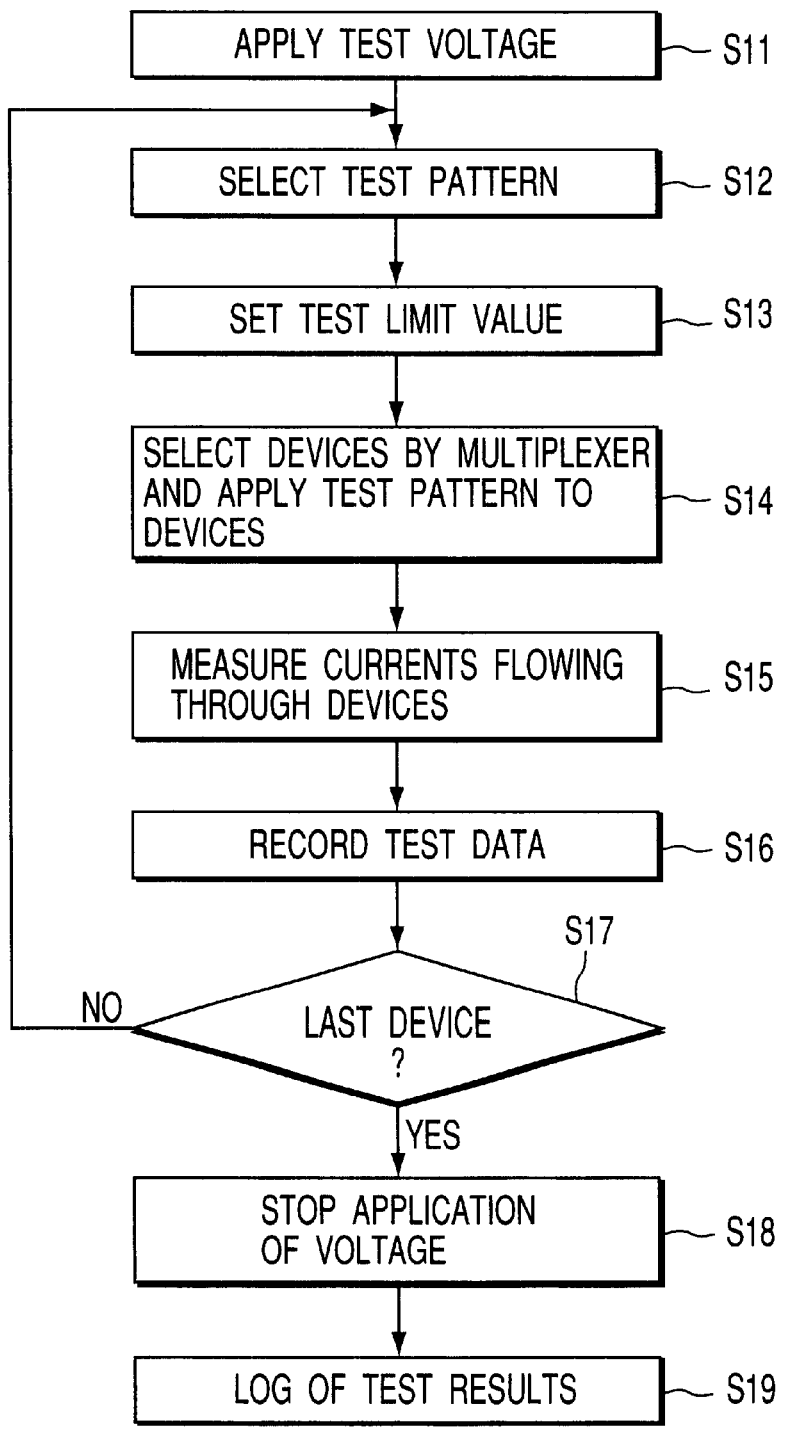
FIG. 4 is a flowchart based on which an IDDQ test is performed with respect to a device that has been determined as a non-defective one in the process shown in FIG. 3.

After the end of Step S9 described above, the IDDQ test is performed by executing the steps shown in FIG. 4. By that time, the defective devices are screened out, and the data on the non-defective devices are stored in the rest result memory 27. Hence, the test sequencer 21 reads the data from the memory 27, and controls the multiplexers 22 and 31 so as to measure the quiescent power supply currents with respect to the non-defective devices. To be more specific, the test voltage from the power supply 19 is simultaneously applied through the current cutoff circuit 24 to all the devices that have been recorded in the test device register 28 as non-defective ones (Step S11).

Subsequently, the test sequencer 21 selects a test pattern (Step S12).

Then, the limit value of the quiescent power supply current, which is to be used for the screening, is set for the current monitor 23 (Step S13). If different limit values are required for the respective test patterns, then the test sequencer 21 changes the limit value for each test pattern.

A test pattern signal is applied from the pattern driver 30 to the devices selected by the multiplexer 31 (Step S14). A quiescent power supply current flows through the nodes of the devices to which the test pattern signal is applied. The current monitor device 23 measures the quiescent power supply current (Step S15). The measured value is compared with the limit value described above so as to determine whether or not the corresponding device is defective or non-defective. If the measured value is greater than the limit value, then the corresponding device is determined as being defective. The measurement data are recorded in the test result memory 27 (Step S16).

Thereafter, a check is made to see whether or not there are devices to be measured (Step S17). If there are devices to be measured, the multiplexers 22 and 31 select devices that should be measured, and the steps S12 to S16 are repeated.

If there is no device to be measured, the power supply voltage is cutoff (Step S18), and the test results are recorded (Step S19).

Although the IDDQ test was described above, the DC test, the AC test, and a function test, etc. can be executed in similar manners. By these tests, various kinds of tests, including a short circuit, an open circuit, an insulation failure, etc., are detected, so that defective devices can be reliably screened out.

As described above, the present invention is featured by the cutoff circuit 24 which cuts off the power supply voltage. If a device under measurement is defective, the power supply voltage is prevented from being applied to that device. Since an abnormal amount of current does not flow from the device to the measurement system, the measurement system is kept from being burned out.

The current monitor device 23 is provided to monitor a quiescent power supply current. By the current monitor device 23, the screening operation, which is based on whether or not a quiescent power source current exceeds a limit value, is performed. It should be noted that the current monitor device 23 is arranged inside the application/measurement module 13 of the prober. Since the measurement system,. including the current monitor device 23, the cutoff circuit 24, etc., are arranged inside the application/measurement module 13 provided for the main prober apparatus 11, the number of wires used for connection between the measurement system and the control station 12 is far smaller than the corresponding number of wires required in the conventional screening apparatus. Moreover, since the wires are as short as possible, it is possible to provide a structure which is not adversely affected by noise.

According to the first embodiment described above, it is not necessary to employ a general-purpose tester, which is large in size. Hence, the IDDQ tester is compact in size and can be realized at low cost.

The IDDQ test is executed with respect to the devices which are left after the screening based on the preliminary test. Hence, the number of devices which must be actually tested can be reduced, and the IDDQ test can be performed with high efficiency.

The devices selected by the multiplexers 22 and 31 can be inspected in units of one or a predetermined number in the state where the wafer W is kept in contact with the I/F board 17. Hence, the throughput of the inspection is high.

Figure 5:
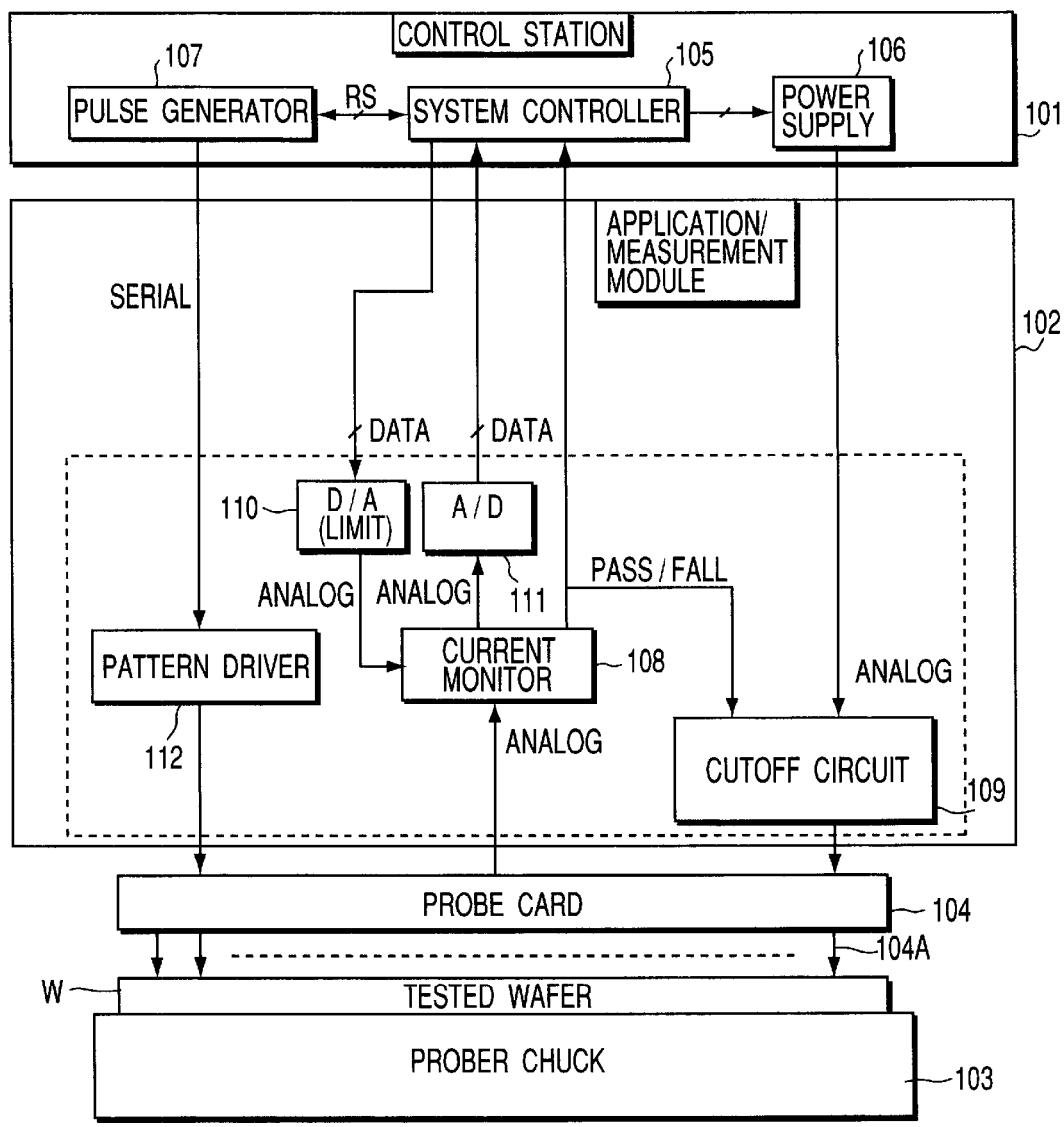
Figure 6:
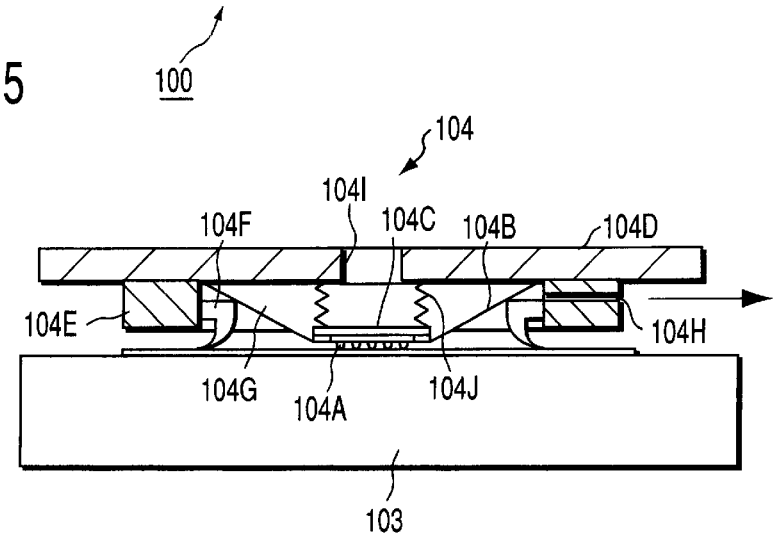
FIG. 6 is a sectional view of a probe card employed in the screening prober shown in FIG. 5.

FIG. 5 shows another embodiment of the present invention. According to this second embodiment, the screening prober 100 executes the tests described in connection with the first embodiment, in such a manner that the wafer W is index-fed. An outward appearance of the screening prober of the second embodiment is similar to that of the screening prober of the first embodiment shown in FIG. 2.

The screening prober 100 of the second embodiment comprises a control station 101, an application/measurement module 102, a prober chuck 103 and a probe card 104. The prober chuck 103 and the probe card 104 jointly constitute a main prober apparatus. As shown in FIG. 5, the control station 101 is provided with a system controller 105, a power supply 106 and a pulse generator 107, and is designed in a similar manner to that of the embodiment shown in FIG. 2. As shown in FIG. 5, the application/measurement module 102 is provided with a current monitor device 108 for monitoring a quiescent power supply current flowing in a device. The application/measurement module 102 is also provided with a cutoff circuit 109 for cutting off the power supply voltage applied from the power supply 106 to a device, in accordance with the monitoring results of the current monitor device 108. The system controller 105 is connected to the current monitor device 108 through a D/A converter 110. By this D/A converter 110, a limit value is set for the current monitor device 108. The current monitor device 108 compares the value of the quiescent power supply current supplied thereto from a device by way of the probe card 104 with the limit value set by the D/A converter 110. In the case where the value of the quiescent power supply current is greater than the limit value, the current monitor device 108 determines that the corresponding device is defective. In the converse case, the current monitor device 108 determines that the corresponding device is non-defective. The cutoff circuit 109 is connected to the current monitor device 108, and prevents the power supply voltage from being applied to a device that is determined as defective by the current monitor device 108. Therefore, an abnormal current, which exceeds the limit value, does not flow from the defective device to the measuring system. To a device that determined as non-defective, the power supply 106 applies a power supply voltage by way of the cutoff circuit 109.

The current monitor device 108 is connected to the system controller 105 through an A/D converter 111. A quiescent power supply current detected by the current monitor device 108 is supplied to the system controller 105 by way of the A/D converter 111. Data on the detected current is stored in a memory of the system controller 105 as quiescent power supply current data.

The application/measurement module 102 is provided with a pattern driver 112 connected to the Pulse generator 107. The pattern driver 112 applies a test pattern signal, which is generated by the pulse generator 107, to a device under measurement by way of the probe card 104.

The probe card 104 may be in the form of an I/F board which is brought into simultaneous contact with all or some of the devices of a wafer W, as shown in FIG. 5. Alternatively, the probe card 104 may be a membrane type card, such as that shown in FIG. 6. Referring to this Figure, the probe card 104 comprises: a membrane 104B on which a plurality of bump contactors 104A are arranged; a push member 104C for pushing the membrane 104B from behind; a support member 104D made of a printed circuit board which is connected to the membrane 104B in the vicinity of the push member 104C; and a frame member 104E for clamping the periphery of the membrane 104B in cooperation with the support member 104D.

A seal member 104F is attached throughout the inner circumference of the frame member 104E. At the time of inspection, the seal member 104F defines an airtight space 104G between a wafer W and the membrane 104B. A through hole 104H is formed in the frame member 104E, and an exhaust pump (not shown) is connected to the through hole 104H. The pressure in the airtight space 104G is lowered by the exhaust pump, as indicated by the arrow shown in FIG. 6.

An opening 104I is formed in the center of the support member 104D. Bellows 104J is attached at one end to the portion of the support member 104D which is located around the opening 104I, and at the other end the bellows 104J is connected to the push member 104C. In other words, the support member 104D is connected to the push member 104C, with the bellows 104J interposed. When, at the time of inspection, the pressure in the airtight chamber 104G is reduced by the exhaust pump, the push member 104C is lowered due to the atmosphere. As a result, the contactors 104A of the membrane 104B are pressed against the wafer W. Since, in this manner, the atmosphere is utilized to press the contactors 104A against the wafer W, it is possible to reduce the load which may be exerted on the prober chuck 103 when the contactors 104A are pressed against the wafer W.

The former screening prober 100 of the second embodiment executes the IDDQ test for each of the devices, while simultaneously index-feeding the prober chuck 103. Except for this point, the screening prober 100 of the second embodiment produces advantages that are similar to those of the screening prober 10 of the first embodiment (FIG. 2).

As described above, the present invention is featured by the cutoff circuit 24 which cuts off the power supply voltage. If a device under measurement is defective, the power supply voltage is prevented from being applied to that device. Since an abnormal amount of current does not flow from the device to the measurement system, the measurement system is kept from being burned out.

According to the present invention, defective devices can be reliably screened out before the electric characteristics of them are inspected by the execution of tests, including the IDDQ test, the DC test, the AC test, and a function test, etc.

According to the present invention, the current monitor device 23 is provided to monitor a quiescent power supply current. By the current monitor device 23, the screening operation, which is based on whether or not a quiescent power source current exceeds a limit value, is performed. It should be noted that the current monitor device 23 is arranged inside the application/measurement module 13 of the prober. Since the measurement system, including the current monitor device 23, the cutoff circuit 24, etc., are arranged inside the application/measurement module 13 provided for the main prober apparatus 11, the number of wires used for connection between the measurement system and the control station 12 is far smaller than the corresponding number of wires required in the conventional screening apparatus. Moreover, since the wires are as short as possible, it is possible to provide a structure which is not adversely affected by noise.

Moreover, it is not necessary to employ a general-purpose tester, which is large in size. Hence, the IDDQ tester is compact in size and can be realized at low cost.

The IDDQ test is executed with respect to the devices which are left after the screening based on the preliminary test. Hence, the number of devices which must be actually tested can be reduced, and the IDDQ test can be performed with high efficiency.

The devices selected by the multiplexers 22 and 31 can be inspected in units of one or a predetermined number in the state where the wafer W is kept in contact with the I/F board 17. Hence, the throughput of the inspection is high.

The present invention is in no way restricted to the embodiments described above.

In the embodiments described above, the screening of devices is executed based on the comparison between a quiescent power supply current and a setting value. The screening can be executed based on other factors, such as variations in the quiescent power supply voltage.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A screening method for screening semiconductor devices formed on a semiconductor wafer, comprising steps of:

applying a power supply voltage to the semiconductor devices;

measuring a quiescent power supply current which flows in each of the semiconductor devices when the power supply voltage is applied thereto;

detecting whether or not a value of the measured quiescent power supply current is greater than a setting value;

cutting off from the power supply voltage a semiconductor device whose quiescent power supply is detected to be greater than the setting value;

recognizing the semiconductor device that is cut off from the power supply voltage as a defective device; and performing an electric characteristic inspection only on semiconductor devices that are determined to be nondefective.

2. The screening method according to claim 1, wherein, in the step of applying the power supply voltage, the power supply voltage is applied to the plurality of devices simultaneously.

3. The screening method according to claim 1, further comprising a step of setting said setting value of the quiescent power supply in accordance with a semiconductor device to be measured.

4. The screening method according to claim 1, further comprising a step of creating a map of defective and non-defective devices.

5. The screening method according to claim 1, wherein the electric characteristics inspection is an IDDQ test.

6. The screening method according to claim 5, wherein a pattern of the IDDQ test is selected in accordance with a semiconductor device to be measured.

7. The screening apparatus for screening semiconductor devices formed on a semiconductor wafer, comprising:

voltage application means for applying a power supply voltage to the semiconductor devices;

measurement means for measuring a quiescent power supply current which flows in each of the semiconductor devices when the power supply voltage is applied thereto;

detection means for detecting whether or not a value of the measured quiescent power supply current is greater than a setting value;

voltage cutoff means for cutting off from the power supply voltage a semiconductor device whose quiescent power supply current is detected to be greater than the setting value;

recognition means for recognizing the semiconductor device that is cut off from the power supply voltage as a defective device; and inspection means for performing an electric characteristic inspection only on semiconductor devices determined to be non-defective.

8. The screening apparatus according to claim 7, wherein said voltage application means for applying the power supply voltage apply the power supply voltage to a plurality of semiconductor devices simultaneously, and said measurement means measure quiescent power supply currents of the plurality of semiconductor devices to which the power supply voltage is applied by the voltage application means, simultaneously.

9. The screening apparatus according to claim 7, further comprising setting means for setting said setting value of the quiescent power supply in accordance with a semiconductor device to be measured.

10. The screening apparatus according to claim 7, further comprising creation means for creating a map of defective and non-defective devices.

11. The screening apparatus to claim 7, wherein the electric characteristics inspection is an IDDQ test.

12. The screening apparatus according to claim 11, wherein a pattern of the IDDQ test is selected in accordance with a semiconductor device to be measured.

* * * * *